United States Patent
Graves

(10) Patent No.: US 10,754,366 B2
(45) Date of Patent: Aug. 25, 2020

(54) POWER SWITCHING CIRCUITS HAVING A SATURABLE INDUCTOR

(71) Applicant: L3 Cincinnati Electronics Corporation, Mason, OH (US)

(72) Inventor: Justin Graves, Middletown, OH (US)

(73) Assignee: L3 Cincinnati Electronics Corporation, Mason, OH (US)

(*) Notice: Subject to any disclaimer, the term of this patent is extended or adjusted under 35 U.S.C. 154(b) by 0 days.

(21) Appl. No.: 16/158,850

(22) Filed: Oct. 12, 2018

(65) Prior Publication Data

US 2019/0377376 A1 Dec. 12, 2019

Related U.S. Application Data

(60) Provisional application No. 62/681,298, filed on Jun. 6, 2018.

(51) Int. Cl.
| | | |
|---|---|---|
| *G05F 1/613* | (2006.01) | |
| *H03K 17/082* | (2006.01) | |
| *H01F 29/14* | (2006.01) | |

(52) U.S. Cl.
CPC .......... *G05F 1/613* (2013.01); *H01F 29/146* (2013.01); *H03K 17/0822* (2013.01)

(58) Field of Classification Search
CPC ...................................................... G05F 1/613
See application file for complete search history.

(56) References Cited

U.S. PATENT DOCUMENTS

| | | | |
|---|---|---|---|
| 3,201,683 A * | 8/1965 | Hjermstad | G05F 1/30 323/263 |
| 5,442,540 A | 8/1995 | Hua et al. | |
| 5,642,267 A | 6/1997 | Brkovic et al. | |
| 5,646,836 A | 7/1997 | Sadarnac et al. | |
| 5,654,880 A | 8/1997 | Brkovic et al. | |
| 5,815,386 A | 9/1998 | Gordon | |
| 6,038,148 A | 3/2000 | Farrington et al. | |
| 6,060,867 A * | 5/2000 | Farrington | H02M 1/34 323/222 |
| 6,118,673 A | 9/2000 | Hua | |
| 6,147,886 A | 11/2000 | Wittenbreder | |
| 6,169,683 B1 | 1/2001 | Farrington | |
| 6,256,214 B1 | 7/2001 | Farrington et al. | |
| 6,349,044 B1 | 2/2002 | Canales-Abarca et al. | |
| 6,785,151 B2 | 8/2004 | Ingman et al. | |
| 6,847,196 B2 | 1/2005 | Garabandic | |
| 7,915,872 B2 | 3/2011 | Lee | |

(Continued)

FOREIGN PATENT DOCUMENTS

| | | |
|---|---|---|
| JP | H08317639 A | 11/1996 |
| JP | 2007151374 A | 6/2007 |
| JP | 2010124673 A | 6/2010 |

*Primary Examiner* — Jue Zhang
*Assistant Examiner* — Trinh Q Dang
(74) *Attorney, Agent, or Firm* — Dinsmore & Shohl LLP

(57) ABSTRACT

Embodiments described herein are directed to power switching circuits having a saturable inductor. In one embodiment, a power switching circuit includes a power switch assembly operable to be connected to a power source. The power switch assembly includes a plurality of parallel power switches connected to and receiving current from the power source and a saturable inductor electrically coupled in series with the plurality of parallel power switches.

20 Claims, 2 Drawing Sheets

(56) References Cited

U.S. PATENT DOCUMENTS

| | | | | |
|---|---|---|---|---|
| 2006/0012545 | A1* | 1/2006 | Kishi | G09G 3/294 345/60 |
| 2006/0097792 | A1* | 5/2006 | Ryu | H03G 1/0029 330/311 |
| 2010/0301826 | A1* | 12/2010 | Moussaoui | H02M 3/1584 323/285 |
| 2012/0007656 | A1* | 1/2012 | Summer | H03K 17/6871 327/432 |
| 2013/0162232 | A1* | 6/2013 | Itoh | G05F 1/595 323/271 |
| 2013/0321079 | A1* | 12/2013 | Lin | H03F 3/217 330/251 |
| 2015/0115709 | A1* | 4/2015 | King | H02J 7/0045 307/10.1 |
| 2017/0222545 | A1* | 8/2017 | Haga | H02M 1/08 |
| 2018/0191259 | A1* | 7/2018 | Zhang | H02M 3/33569 |

* cited by examiner

POWER SWITCHING CIRCUITS HAVING A SATURABLE INDUCTOR

CROSS-REFERENCE TO RELATED APPLICATIONS

This application claims priority to U.S. Provisional Patent Application No. 62/681,298 entitled "Saturable Inductor for Power Switch Circuit Applications" and filed on Jun. 6, 2018, which is hereby incorporated by reference in its entirety.

TECHNICAL FIELD

Embodiments of the present disclosure are directed to power switching circuits. More specifically, the embodiments described herein are directed to power switching circuits having a saturable inductor.

BACKGROUND

When a system of parallel power switches is connected to a power source, one of the power switches turns on first and carries the initial inrush of load current, before the other power switches turn on. This can overheat and destroy the power switch that turns on first. It is desirable to have a circuit where all the power switches turn on at the same time. It is further desirable for the power switches to be hardened from radiation and single event effects (SEE), be capable of withstanding shock and vibration during high-reliability space applications and have low power dissipation and heat generation without adding further complexity and cost.

SUMMARY

Embodiments described herein are directed to power switching circuits having a saturable inductor. In one embodiment, a power switching circuit includes a power switch assembly operable to be connected to a power source. The power switch assembly includes a plurality of parallel power switches connected to and receiving current from the power source and a saturable inductor electrically coupled in series with the plurality of parallel power switches.

In another embodiment, a power switching circuit includes a power source and a power switch assembly connected to the power source. The power switch assembly includes a plurality of parallel power switches connected to and receiving current from the power source. The power switch assembly further includes a saturable inductor electrically coupled in series with the plurality of parallel power switches and one or more switching components electrically coupled in series with the saturable inductor such that when the plurality of parallel power switches are turned off, the one or more switching components enable any residual current to flow through to the saturable inductor. The saturable inductor a core made of a saturating core material which saturates over a time period between about 10 microseconds and about 100 microseconds to an inductance of about 31 nH.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to a power switching circuit having a saturable inductor. In particular, embodiments described herein are directed to a power switching circuit having the saturable inductor in series with a plurality of parallel power switches.

The addition of a saturable inductor in series with multiple parallel switches serves to delay inrush of load current until all the power switches have turned on. A normal, unsaturable inductor could accomplish the same task, but the unsaturable inductor would then contribute inductance to the resonance of the LC (inductor-capacitor) circuit on the power bus, potentially damaging components on the power bus with high peak voltages and currents during load transients. However, the saturable inductor used herein saturates after a specific time without significantly contributing inductance to the LC resonance on the power bus during load transients.

Figure 1:
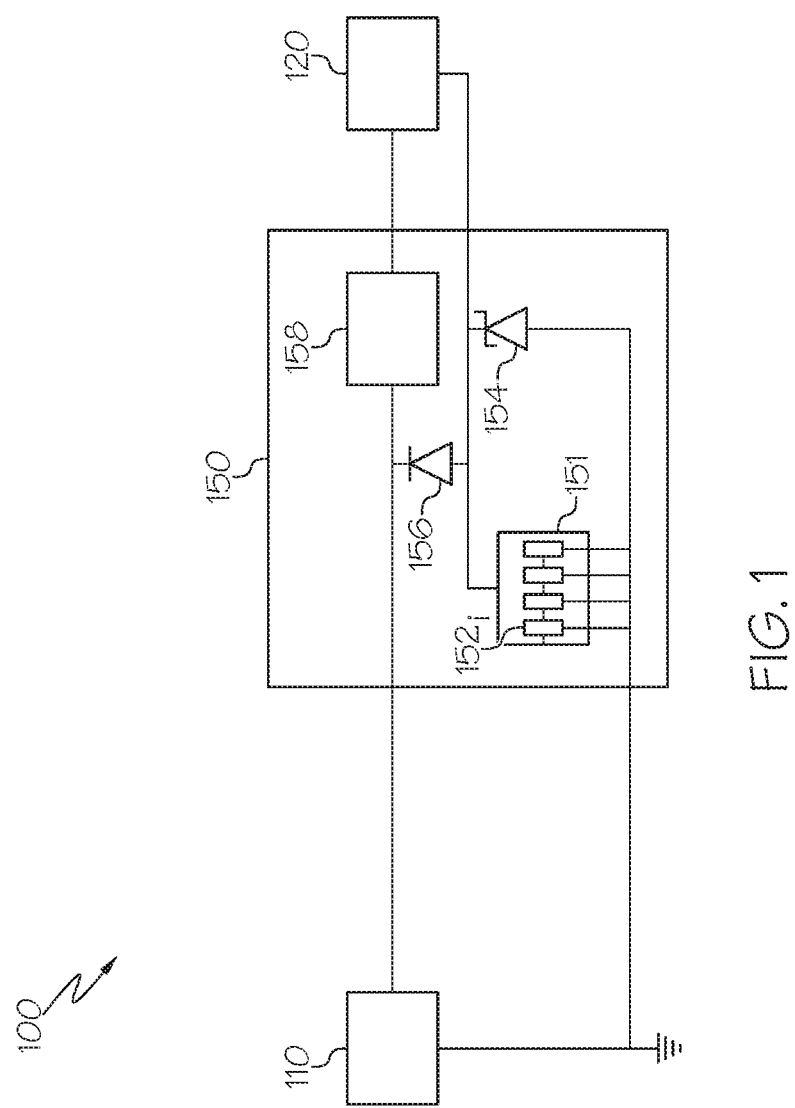
FIG. 1 schematically depicts a power switching circuit having a saturable inductor, according to one or more embodiments described and illustrated herein.

FIG. 1 schematically depicts a power switching circuit 100 having a power switch assembly 150 used to regulate the flow of current to a load 120 from a power source 110. The power source 110 is connected to the power switch assembly 150 at one end and to ground at the other end. The power source 110 can deliver any magnitude of voltage and current allowed by switching technology known in the art.

The power switch assembly 150 has a plurality of power switches $152_i$ (where i=1, 2, 3, ..., n and n is a positive integer), where the power switches $152_i$ are arranged in a parallel configuration to form a system 151 of parallel power switches $152_i$. In the embodiment depicted in FIG. 1, the power switch assembly 150 has a plurality of four power switches $152_i$. As a non-limiting example, each of the power switches $152_i$ may be a metal-oxide semiconductor field-effect transistor (MOSFET), a bipolar junction transistor (BJT), a tube switch, a relay, or a mechanical toggle switch. The plurality of power switches $152_i$ are connected to and receive current from the power source 110.

The power switch assembly 150 has a saturable inductor 158 electrically coupled in series with the plurality of power switches $152_i$. As used herein, 'saturable inductor' means an inductor having a magnetic core that can be magnetized by a direct electric current through a winding around the magnetic core to a magnetization state where the yielded magnetic flux density levels off with application of additional current. The saturable inductor 158 has a core made of a saturating core material. While a soft saturating core material such as, but not limited to, Kool Mµ® is preferred, a hard saturating core material may also be used. The saturable inductor 158 saturates over a time period between about 10 microseconds and about 100 microseconds. The saturable inductor 158 has an inductance of about 31 nH upon saturation.

The example power switch assembly 150 has a diode 156 functioning as a free-wheeling diode in the power switching circuit 100. The diode 156 is electrically coupled in series with the saturable inductor 158 such that when the plurality of parallel power switches $152_i$ are turned off, the diode 156 enables any residual current to flow through to the saturable inductor 158. In some embodiments, the diode 156 may be replaced by a switch. The switch may be electrically coupled in series with the saturable inductor 158 such that when the plurality of parallel power switches $152_i$ are turned off, the switch turns on and enables any residual current to flow through to the saturable inductor 158.

In some embodiments, the power switch assembly 150 has a diode 154 electrically coupled in parallel to the plurality of parallel power switches $152_i$. When the plurality of parallel power switches $152_i$ are turned off, the transient suppression diode 154 limits the voltage across each power switch $152_i$ to the amount each power switch $152_i$ is rated for. Thus the diode 154 protects the plurality of parallel power switches $152_i$ from damage due to voltage transients.

The power switches $152_i$ and other components may be implemented using any parts grade built to survive under radiation and single event effects (SEE). As a non-limiting example, the power switches $152_i$ may be fabricated from radiation-hardened components, such as from space-grade rad/SEE-hard to commercial grade rad/SEE-soft material. Accordingly, the power switching circuit 100 described herein may be incorporated in power supplies deployed in space or nuclear applications, for example.

Figure 2:
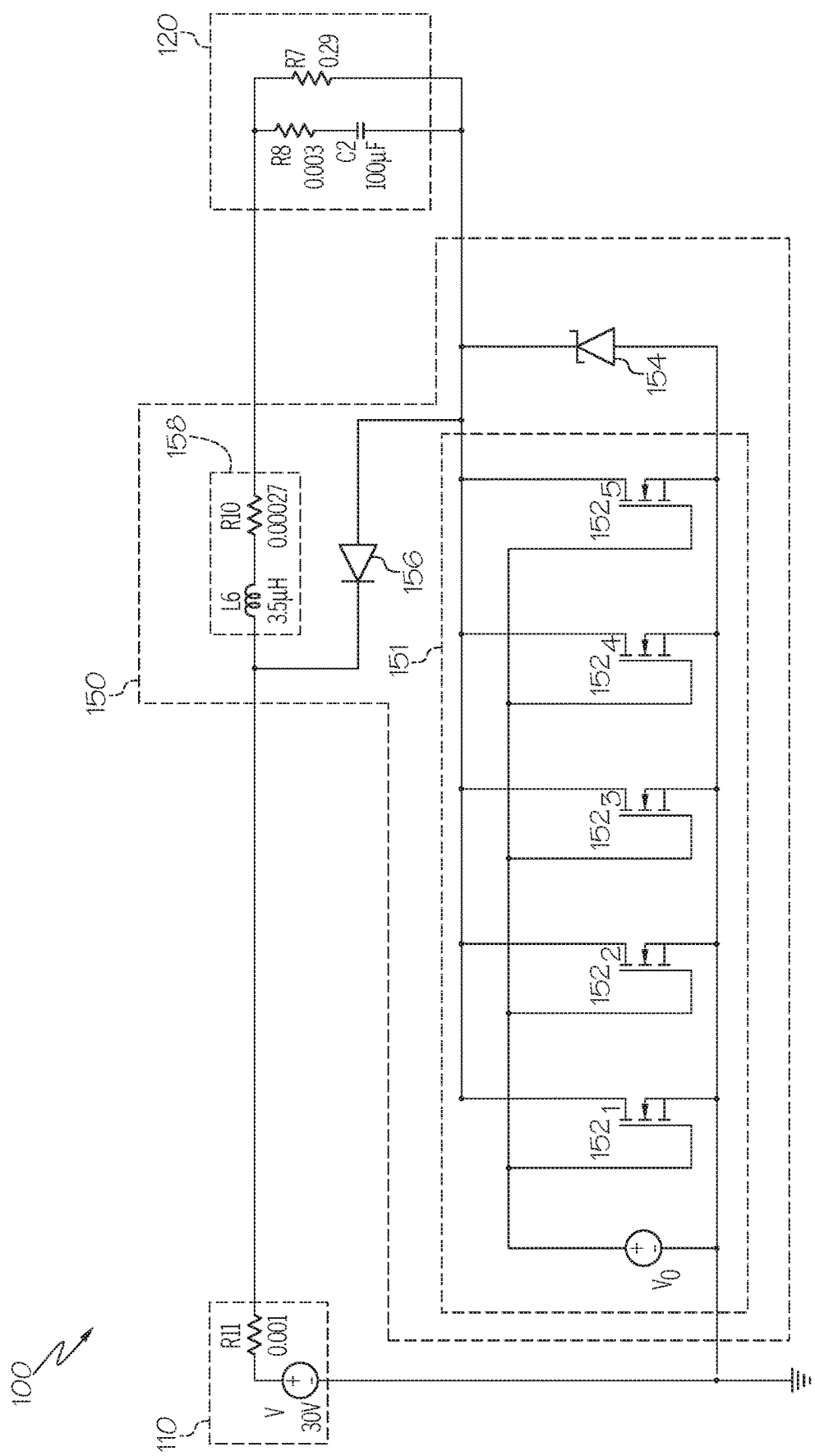
FIG. 2 schematically depicts an example power switching circuit having a saturable inductor, according to one or more embodiments described and illustrated herein.

FIG. 2 schematically depicts an example power switching circuit 100 electrically coupled to the load 120 as described above. As used herein, the phrase "electrically coupled" means either directly electrically coupled by electrical conductors or indirectly electrically coupled by way of intermediate electrical components and/or electrical conductors. The power switching circuit 100 has a power source 110 which includes a voltage source V in series with a resistor R11 having resistance 0.001 ohms. The voltage source V is connected at one end to the power switch assembly 150 and to ground at the other end. In some embodiments as shown in FIG. 2, the voltage source V is a 30V battery that provides current to the load 120 through the power switch assembly 150. The load 120 includes a resistor R7 having resistance 0.29 ohms in parallel with a resistor R8 having resistance 0.003 ohms in series with a capacitor C2 having capacitance 100 microFarads. The components of the power source 110 and the load 120 as shown in FIG. 2 are for illustrative purposes only and not limited as such.

The power switch assembly 150 includes a plurality of parallel power switches $152_i$ which are MOSFET switches. The system 151 of parallel power switches $152_i$ is coupled to a voltage source $V_o$ which drives the operation of each of the power switches $152_i$.

The saturable inductor 158 in FIG. 2 includes an inductor L6 having inductance 3.5 microHenry. The resistance of the winding of the inductor L6 may be represented by a resistor R10 having resistance 0.00027 ohms in series with the inductor L6. The diode 154 is connected parallel to the system 151 of parallel power switches $152_i$ such that the plurality of parallel power switches $152_i$ are protected from voltage transients while turning off. The freewheeling diode 156 is connected in series with the saturable inductor 158 such that when the plurality of parallel power switches $152_i$ are turned off, the diode 156 can divert any residual current away from the plurality of parallel power switches $152_i$ and into the saturable inductor 158. The components of the saturable inductor 158 as shown in FIG. 2 are for illustrative purposes only and not limited as such.

Other ancillary electrical components may be added to the power switching circuit 100 depicted in FIG. 2 depending on the end application. It should be understood that embodiments are not limited by the ancillary electrical components shown in FIG. 2.

As mentioned above, the power switching circuit 100 can be advantageously used to delay inrush of load current until all of the power switches $152_i$ have turned on. Initially, before the power source 110 is turned on, all the power switches $152_i$ are off and have no current flowing through them.

When a voltage source $V_O$ electrically connected to the power switches $152_i$ is turned on, the saturable inductor 158 limits inrush of load current to the power switches $152_i$ and then progressively saturates over a short period of time (in the order of about 10-100 microseconds). As a result, the peak inrush of load current in the power switches $152_i$ is significantly reduced (by about 90% compared to when the power switching circuit 100 does not have the saturable inductor 158) and the peak power dissipation of the power switches $152_i$ is also significantly reduced (by about 99% compared to when the power switching circuit 100 does not have the saturable inductor 158) to meet the junction temperature rating of the power switches $152_i$. Without the saturable inductor 158, the power dissipation and heat generation in the power switches $152_i$ would exceed the junction temperature rating during the inrush of load current.

As the current in the saturable inductor 158 rises, the inductance of the saturable inductor 158 decreases smoothly as it progresses toward saturation. The core of the saturable inductor 158 is fully saturated after a predetermined time (V*s). Thus, the saturable inductor 158 acts as a magnetic timer giving the power switches $152_i$ ample time to turn on before the inrush current reaches a high level. The power switches $152_i$ turn on one at a time due to variation in threshold voltage and gate capacitance. The current from the power source 110 is shared once all the power switches $152_i$ are on. This design can accommodate twice the power imbalance in the circuit while still meeting the thermal derating.

During normal operation of the power switching circuit 100, the load transient responses are controlled, as the saturable inductor 158 becomes saturated during steady-state current flow. Bus ringing due to LC resonance is minimized as the saturable inductor 158 becomes saturated, resulting in a small inductance (about 31 nH). This relatively low inductance has minimal effect on the operation of the power switching circuit 100. During steady-state operation, the power switching circuit 100 becomes insensitive to variations in turn-on times and thresholds of the power switches $152_i$.

When the power source 110 is turned off, the power switches $152_i$ begin to turn off one at a time, due to variation in threshold voltage and gate capacitance and the last power switch $152_i$ to turn off carries the entire load current. The diode 154 protects the power switches $152_i$ from any voltage transients during the turn-off process.

After the last power switch $152_i$ has turned off, voltage across the saturable inductor 158 reverses to keep any residual load current flowing. The residual load current flows through the diode 156 instead of the power switches $152_i$ and into the saturable inductor 158. This drives the core of the saturable inductor 158 towards a reset, as the residual load current decays to zero. Accordingly, the power switching circuit 100 becomes ready for the next round of operation.

The power switching circuit described herein allows the parallel power switches to turn on one at a time, non-destructively, thereby eliminating both the need to use matched sets of power switches and the need for complex gate drive circuitry. The power switching circuit with the saturable inductor protects the power switches from the inrush of load current during turn-on. It also protects the power bus from potentially damaging LC resonance during steady-state normal operation.

The power switching circuit design described herein can be easily scaled to higher as well as lower voltages and currents. The power switching circuit design can be implemented in any commercial, industrial or space application that switches power to a load through multiple power switches in a parallel configuration. For example, in one space application, each power switch may be a radiation-hardened power switch rated for 30 V at 100 A, as described above.

For the purposes of describing and defining embodiments of the present disclosure, it is noted that the terms "about" and "substantially" are utilized herein to represent the inherent degree of uncertainty that may be attributed to any quantitative comparison, value, measurement, or other representation. The terms "about" and "substantially" are also utilized herein to represent the degree by which a quantitative representation may vary from a stated reference without resulting in a change in the basic function of the subject matter at issue.

The foregoing description of the various embodiments described herein has been presented for the purposes of illustration and description. It is not intended to be exhaustive or to limit the embodiments to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope as defined by the claims.

What is claimed is:

1. A power switching circuit comprising:
   a power switch assembly operable to be connected to a power source, the power switch assembly comprising:
      a plurality of parallel power switches connected to and receiving current from the power source; and
      a saturable inductor electrically coupled in series with the plurality of parallel power switches for reducing a flow of load current over time into the plurality of parallel power switches without contributing inductance to LC resonance of the power switching circuit during load transients.

2. The power switching circuit of claim 1 further comprising a power supply electrically connected to the power switch assembly.

3. The power switching circuit of claim 1, wherein each power switch comprises a metal oxide semiconductor field-effect transistor (MOSFET), a bipolar junction transistor (BJT), a tube switch, a relay, or a mechanical toggle switch.

4. The power switching circuit of claim 1, wherein:
   each power switch is a metal-oxide-semiconductor field-effect-transistor (MOSFET) having a source and a drain;
   each metal-oxide-semiconductor field-effect-transistor (MOSFET) is electrically coupled to ground at the source; and
   each metal-oxide-semiconductor field-effect-transistor (MOSFET) is electrically coupled to each other at the drain.

5. The power switching circuit of claim 1, wherein the saturable inductor further comprises a core made of a saturating core material.

6. The power switching circuit of claim 1, wherein the saturable inductor saturates over a time period between about 10 microseconds and about 100 microseconds.

7. The power switching circuit of claim 1, wherein the saturable inductor has an inductance of about 31 nH upon saturation.

8. The power switching circuit of claim 1, wherein the power switch assembly further comprises one or more switching components electrically coupled in series with the saturable inductor such that when the plurality of parallel power switches are turned off, the one or more switching components enable any residual current to flow through to the saturable inductor.

9. The power switching circuit of claim 1, wherein the power switch assembly further comprises one or more diodes electrically coupled in parallel to the plurality of parallel power switches such that when the plurality of parallel power switches are turned off, the one or more diodes limit the voltage across each power switch to the amount each power switch is rated for.

10. The power switching circuit of claim 1, wherein each power switch is a radiation-hardened component.

11. The power switching circuit of claim 1, wherein each power switch is rated for 30V at 100 A.

12. The power switching circuit of claim 2, wherein the power supply is a 30V battery.

13. The power switching circuit of claim 8, wherein:
   each switching component is a diode having an anode and a cathode;
   each power switch is a metal-oxide-semiconductor field-effect-transistor (MOSFET) having a source and a drain;
   the anode is electrically connected to the drain; and
   the cathode is electrically connected to the saturable inductor.

14. A power switching circuit comprising:
   a power source; and
   a power switch assembly connected to the power source, the power switch assembly comprising:
      a plurality of parallel power switches connected to and receiving current from the power source;
      a saturable inductor electrically coupled in series with the plurality of parallel power switches for reducing a flow of load current over time into the plurality of parallel power switches without contributing inductance to LC resonance of the power switching circuit during load transients, wherein the saturable inductor comprises a core made of a saturating core material which saturates over a time period between about 10 microseconds and about 100 microseconds to an inductance of about 31 nH; and
      one or more switching components electrically coupled in series with the saturable inductor such that when the plurality of parallel power switches are turned off, the one or more switching components enable any residual current to flow through to the saturable inductor.

15. The power switching circuit of claim 14, wherein each power switch comprises a metal-oxide semiconductor field-effect transistor (MOSFET), a bipolar junction transistor (BJT), a tube switch, a relay, or a mechanical toggle switch.

16. The power switching circuit of claim 14, wherein:
each power switch is a metal-oxide-semiconductor field-effect-transistor (MOSFET) having a source and a drain;
each metal-oxide-semiconductor field-effect-transistor (MOSFET) is electrically coupled to ground at the source; and
each metal-oxide-semiconductor field-effect-transistor (MOSFET) is electrically coupled to each other at the drain.

17. The power switching circuit of claim 14, wherein:
each switching component is a diode having an anode and a cathode;
each power switch is a metal-oxide-semiconductor field-effect-transistor (MOSFET) having a source and a drain;
the anode is electrically connected to the drain; and
the cathode is electrically connected to the saturable inductor.

18. The power switching circuit of claim 14, wherein each power switch is rated for 30V at 100 A.

19. The power switching circuit of claim 14, wherein each power switch is a radiation-hardened component.

20. The power switching circuit of claim 14, wherein the power switch assembly further comprises one or more diodes electrically coupled in parallel to the plurality of parallel power switches such that when the plurality of parallel power switches are turned off, the one or more diodes limit the voltage across each power switch to the amount each power switch is rated for.

* * * * *